(12) United States Patent
Liu et al.

(10) Patent No.: US 11,837,523 B2
(45) Date of Patent: Dec. 5, 2023

(54) INVERTER

(71) Applicant: Tesla, Inc., Austin, TX (US)

(72) Inventors: Wenjun Liu, Santa Clara, CA (US); Robert James Ramm, Mountain View, CA (US); Alan David Tepe, Fremont, CA (US); Colin Kenneth Campbell, San Francisco, CA (US); Dino Sasaridis, San Francisco, CA (US)

(73) Assignee: Tesla, Inc., Austin, TX (US)

( * ) Notice: Subject to any disclaimer, the term of this patent is extended or adjusted under 35 U.S.C. 154(b) by 0 days.

(21) Appl. No.: 17/966,614

(22) Filed: Oct. 14, 2022

(65) Prior Publication Data

US 2023/0037192 A1 Feb. 2, 2023

Related U.S. Application Data

(62) Division of application No. 15/334,090, filed on Oct. 25, 2016, now Pat. No. 11,476,179.

(51) Int. Cl.
*H01L 23/373* (2006.01)
*H01L 27/07* (2006.01)
(Continued)

(52) U.S. Cl.
CPC ........ *H01L 23/3736* (2013.01); *H01L 23/367* (2013.01); *H01L 23/3735* (2013.01); *H01L 23/53238* (2013.01); *H01L 24/75* (2013.01); *H01L 27/0711* (2013.01); *H01L 27/0727* (2013.01); *H02M 7/003* (2013.01); *H02M 7/537* (2013.01); *H01L 23/3677* (2013.01); (Continued)

(58) Field of Classification Search
CPC ... H02M 7/003; H02M 7/537; H01L 29/1608; H01L 29/2003; H01L 23/53223; H01L 23/53228; H01L 23/53233; H01L 23/53238; H01L 23/3735; H01L 23/3736; H01L 27/0711; H01L 27/0716; H01L 27/0722; H01L 27/0727
See application file for complete search history.

(56) References Cited

U.S. PATENT DOCUMENTS 5,444,295 A * 8/1995 Lake ................ H02M 7/003
257/690
9,530,723 B2 12/2016 Muto et al.
(Continued)

FOREIGN PATENT DOCUMENTS

JP 2001-308263 11/2011
JP 2003-031765 1/2013
(Continued)

OTHER PUBLICATIONS

International Searching Authority; International Search Report and Written Opinion; International Application No. PCT/US2017/056329/; Jan. 11, 2018; 11 pgs.

*Primary Examiner* — Latanya N Crawford Eason
(74) *Attorney, Agent, or Firm* — Knobbe, Martens, Olson & Bear, LLP

(57) ABSTRACT

A transistor package comprising: a substrate; a first transistor in thermal contact with the substrate, wherein the transistor comprises a gate; the substrate sintered to a heat sink through a sintered layer; an encapsulant that at least partially encapsulates the first transistor; and a Kelvin connection to the transistor gate.

22 Claims, 15 Drawing Sheets

(51) Int. Cl.
    *H01L 23/532*    (2006.01)
    *H02M 7/537*     (2006.01)
    *H02M 7/00*      (2006.01)
    *H01L 23/00*     (2006.01)
    *H01L 23/367*    (2006.01)
    *H01L 29/20*     (2006.01)
    *H01L 29/16*     (2006.01)
    *H01L 29/78*     (2006.01)
    *H01L 25/11*     (2006.01)
    *H01L 25/18*     (2023.01)
    *H01L 25/07*     (2006.01)
    *H01L 29/739*    (2006.01)

(52) U.S. Cl.
    CPC .............. *H01L 24/29* (2013.01); *H01L 24/32* (2013.01); *H01L 24/83* (2013.01); *H01L 25/074* (2013.01); *H01L 25/115* (2013.01); *H01L 25/117* (2013.01); *H01L 25/18* (2013.01); *H01L 29/1608* (2013.01); *H01L 29/2003* (2013.01); *H01L 29/7395* (2013.01); *H01L 29/78* (2013.01); *H01L 2224/29339* (2013.01); *H01L 2224/32145* (2013.01); *H01L 2224/32225* (2013.01); *H01L 2224/753* (2013.01); *H01L 2224/7598* (2013.01); *H01L 2224/8384* (2013.01); *H01L 2924/1033* (2013.01); *H01L 2924/10253* (2013.01); *H01L 2924/10272* (2013.01); *H01L 2924/12036* (2013.01); *H01L 2924/13055* (2013.01); *H01L 2924/13091* (2013.01); *H01L 2924/3511* (2013.01)

(56) References Cited

U.S. PATENT DOCUMENTS

| | | |
|---|---|---|
| 9,722,509 B2 | 8/2017 | Mashimo et al. |
| 10,137,789 B2 | 11/2018 | Xu et al. |
| 2012/0106220 A1 | 5/2012 | Yamaguchi et al. |
| 2013/0241082 A1 | 9/2013 | Okamura |
| 2013/0249100 A1 | 9/2013 | Morishita et al. |
| 2013/0328185 A1 | 12/2013 | Hiramitsu et al. |
| 2014/0167241 A1 | 6/2014 | Matsuoka |
| 2015/0216067 A1 | 7/2015 | McPherson et al. |
| 2016/0307826 A1 | 10/2016 | McKnight-MacNeil et al. |
| 2017/0036563 A1 | 2/2017 | Degner et al. |
| 2017/0271999 A1 | 9/2017 | Yoshinagi et al. |
| 2017/0311482 A1 | 10/2017 | Ikeda et al. |
| 2017/0353177 A1 | 12/2017 | Xu et al. |
| 2018/0022220 A1 | 1/2018 | Xu et al. |
| 2018/0056795 A1 | 3/2018 | Xu et al. |
| 2018/0114740 A1 | 4/2018 | Liu et al. |

FOREIGN PATENT DOCUMENTS

| | | |
|---|---|---|
| JP | 2014-067897 | 4/2014 |
| WO | WO 14/050278 | 4/2014 |
| WO | WO 16/067835 | 5/2016 |

\* cited by examiner

INVERTER

RELATED APPLICATIONS

This application is a divisional application of U.S. patent application Ser. No. 15/334,090, entitled "INVERTER," filed on Oct. 25, 2016, the contents of which is hereby incorporated by reference in its entirety.

TECHNICAL FIELD

The present disclosure relates to inverters, the synthesis of inverters, the transistors used within an inverter, and the packaging of the inverters.

BACKGROUND

Inverters are important components of electric automobiles. An inverter is an electrical device that converts electricity in the form of direct current (DC) to an alternating current (AC). The alternating current can then be used to drive an AC motor. During the process of converting DC to AC, heat is generated. Dissipating the heat, while using cost-effective materials, is important to allow the inverter to operate in an efficient manner.

The present disclosure aims to provide embodiments to solve one or more of the above problems. The present disclosure, which includes improvements to the inverter packaging and inverter structure describes embodiments that allow the inverter to be more efficient and cost effective. This allows benefits when producing inverters on an industrial scale.

Figure 1:
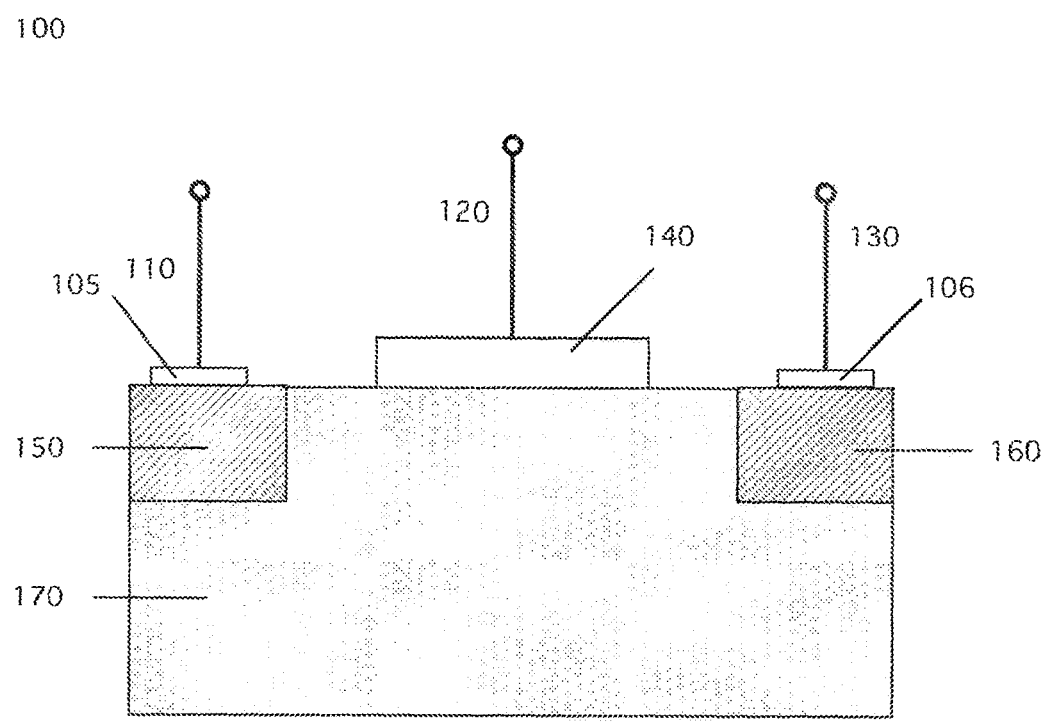
FIG. 1 illustrates a metal-oxide-semiconductor-field-effect transistor (MOSFET) structure according to certain embodiments of the invention.

Embodiments of the present disclosure and their advantages are best understood by referring to the detailed description that follows. It should be appreciated that like reference numerals are used to identify like elements illustrated in one or more of the figures, wherein showings therein are for purposes of illustrating embodiments of the present disclosure and not for purposes of limiting the same.

DETAILED DESCRIPTION

The present invention relates to the packaging of transistors used in an inverter and apparatus and methods used to ensure good connections between the packaged transistors and the heat sink to dissipate excess heat.

The present disclosure aims to provide embodiments to solve one or more of the above problems. The present disclosure, which describes improvements to the inverter packaging and inverter structure, describes embodiments that allow the inverter to be more efficient and cost effective. This allows benefits when producing inverters on an industrial scale.

Figure 9:
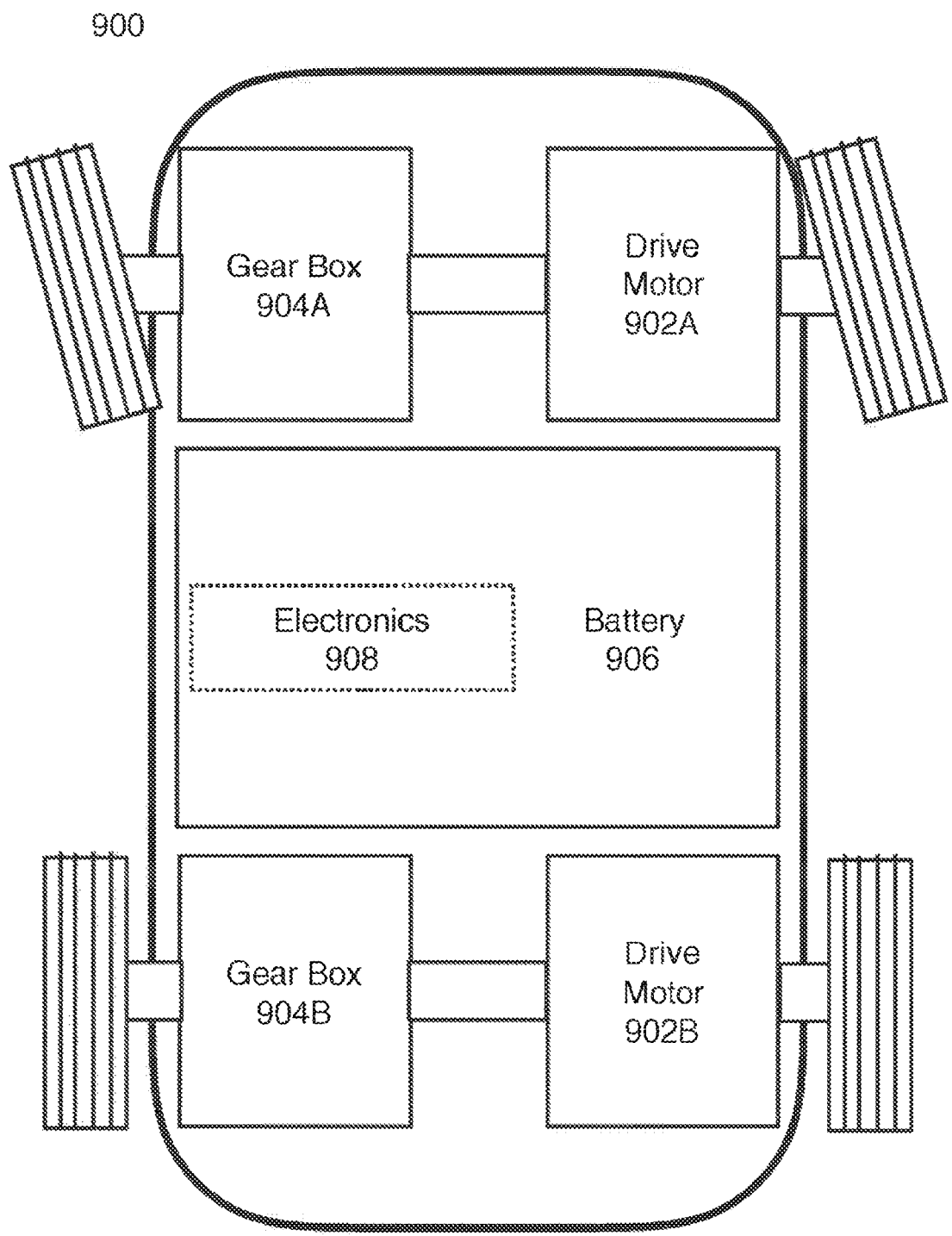
FIG. 9 illustrates the basic components of a battery powered electric vehicle, according to one embodiment.

FIG. 9 illustrates the basic components of a battery powered electric vehicle (electric vehicle) 900. The electric vehicle 900 includes at least one drive motor (traction motor) 902A and/or 902B, at least one gear box 904A and/or 904B coupled to a corresponding drive motor 902A and/or 902B, a battery 906 and electronics 908. Generally, the battery 906 provides electricity to power electronics of the electric vehicle 900 and to propel the electric vehicle 900 using the drive motor 902A and/or 902B. The electric vehicle 900 includes a large number of other components that are not described herein but known to one or ordinary skill. While the construct of the electric vehicle 900 of FIG. 9 is shown to have four wheels, differing electric vehicles may have fewer or more than four wheels. Further, differing types of electric vehicles 900 may incorporate the inventive concepts described herein, including motor cycles, aircraft, trucks, boats, train engines, among other types of vehicles. Certain parts created using embodiments of the present invention may be used in vehicle 900.

An inverter is an electrical device that converts electricity in the form of direct current (DC) to an alternating current (AC). The alternating current can be used to drive an AC motor. The electricity can be stored in a hybrid battery, such as battery 906 used in electric car 900 shown in FIG. 9. The inverter according to certain embodiments of the present invention can be used to convert DC to AC for use by drive motors 902A and 902B. The drive motors can be an AC induction motor. An AC inductive motor generally comprises a stator itself comprising a ring of electromagnetics.

Figure 10:
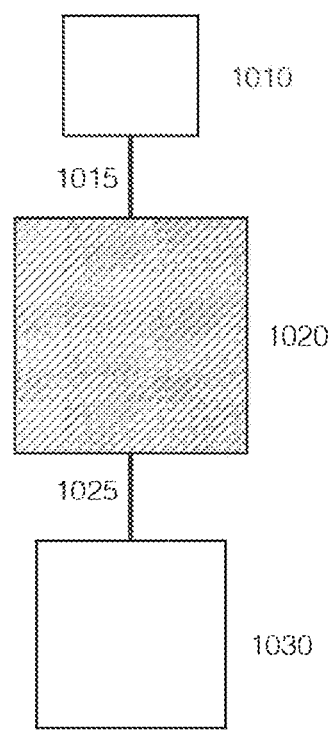
FIG. 10 illustrates the connections between the battery, inverter, and AC induction motor according to certain embodiments of the invention.

FIG. 10 illustrates the connections between the battery, inverter, and AC induction motor according to certain embodiments of the invention. Direct current (DC) is stored in battery 1010 and transferred to inverter 1020 through connection 1015. Inverter 1020 comprises one or more transistor package. The transistor package comprises one or more transistors that inverts the DC to alternating current (AC). The AC is then transferred to AC induction motor 1030 through connector 1025. Connector 1025 includes a busbar as described in further detail below. In certain embodiments, the busbar includes three flat prongs or "fingers" that allows for a low-impedance connection to be formed, which results in improved efficiency over conventional connections.

During the process of converting a DC-energy source to an AC-energy source, heat is generated as a byproduct. Much of this heat is generated by the semiconductor-based transistor or transistors used within the inverter. Certain embodiments of the present disclosure provide more efficient ways to dissipate heat. In certain embodiments, heat is dissipated from the transistor by connecting the substrate or a cladding layer of the transistor structure to a heat sink through a sintered layer. In certain embodiments, the sintered layer is form by sintering the substrate or cladding layer of the transistor to the heat sink with a sintering layer comprising silver.

When the cladding layer and the heat sink are sintered together, a large force may be required. The use of a large force may break or deform parts of the inverter, such as the fins. Certain embodiments of the present invention use a force applied to both the top and the bottom of the inverter to sinter the cladding layer and the heat sink together using a silver layer. In certain embodiments, double-sided independently actuated press blocks are used when sintering the transistor packages within the inverter. The blocks allow for pressure to be applied more uniformly.

Figure 5A:
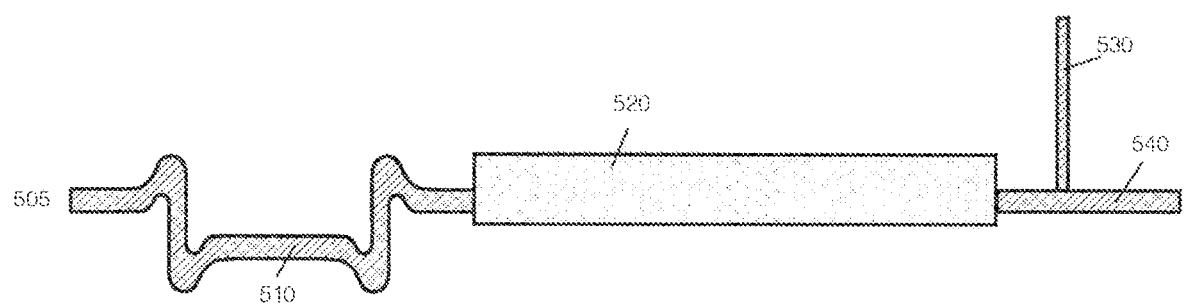
FIG. 5A illustrates a transistor package according to certain embodiments of the present invention.

The flow of current through regulated and low-impedance paths is also important. In certain embodiments of the present invention a connector that electrically connects the transistor within the transistor package includes a u-bend. The u-bend effectively reduces thermal stresses and fatigue during the sintering process. An example of a u-bend is a bend that looks like the letter "U." Element 510 in FIG. 5A illustrates another example of a u-bend.

Additional efficiencies are created using certain embodiments of the present invention by using specifically designed busbars and connections within the inverter. The busbars and connections according to certain embodiments of the present invention allow for reduced and controlled impedances in the inverter. In certain embodiments of the present invention, a Kelvin connection is connected directly to the gate of a metal-oxide-semiconductor-field-effect transistor (MOSFET) or an insulated-gate bipolar transistor (IGBT) structure that is used within the inverter. In certain embodiments of the present invention, a busbar connects multiple transistor packages in a horizontal configuration to reduce impedance.

Figure 3:
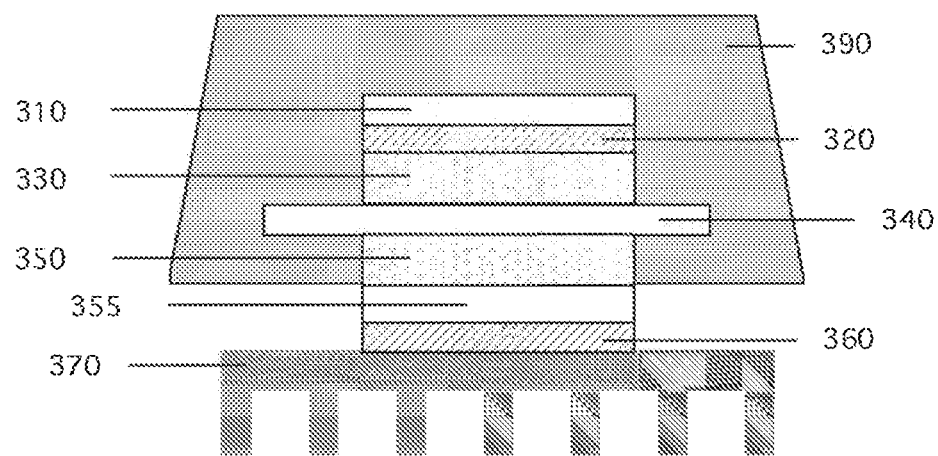
FIG. 3 is a schematic illustration of the internal structure of the inverter and packaging according to certain embodiments of the present invention.

FIG. 3 is a schematic illustration of the internal structure of the inverter and packaging according to certain embodiments of the present invention. Inverter packaging 300 comprises a silicon die 310 that is then sintered to a semiconductor device comprising layers 330-350 through sintering layer 320. Layer 330 is a copper cladding layer. Layer 330 may be an n-type or a p-type cladding layer. Layer 350 is also a copper cladding layer. Between cladding layers 330 and 350, is semiconductor layer 340. Encasing at least a portion of the structure is encapsulant 390. Encapsulant 390 may comprise a polymer, such as an epoxy resin, polyimide, polyurethane, poly (phenylene sulfide), polyester, polyols, or other plastic. An advantage of the use of the encapsulant in the present disclosure is to protect the semiconductor device and any interconnects from moisture, corrosion-inducing contaminants, ultraviolet radiation, and any other environmental factors. The encapsulant of the present disclosure also protects the semiconductor device and any interconnects from mechanical damage such as bending, vibration, or fatigue.

Semiconductor layer 340 may comprise silicon, gallium nitride, silicon carbide, another III-V semiconductor, or another semiconductor. In certain embodiments, semiconductor layer 340 comprises silicon, gallium nitride, silicon carbide, another III-V semiconductor, or another semiconductor. In certain embodiments, semiconductor layer 340 comprises a pn diode (which may be referred to as a pn junction or a diode). The pn diode may comprise two semiconductor layers: a p-type semiconductor layer and an n-type semiconductor layer. In certain embodiments, the two semiconductor layers comprise p-type and n-type of one of the following semiconductors: silicon, gallium nitride (GaN), silicon carbide (SiC), another III-V semiconductor, or another semiconductor. In certain embodiments, a wide-band gap is desired and SiC or GaN is used.

The layers that generate heat are thermally connected to heatsink 370, typically by sintering the cladding later 350 to the heatsink 370 through sintering layer 360. Preferably, heatsink 370 comprises fins and contact pads as will be described further with reference to FIGS. 7A-7C.

In certain embodiments, cladding layer 350 is a thick layer of copper for thermal spreading. Cladding layer 350 may be formed on a substrate 355, such as a direct-bonded-copper substrate (DBC), an active-metal-braze substrate (AMB), or a direct-plated-copper substrate (DPC). In certain embodiments, sintering layer 360 is a silver layer. Sintering layer 360 provides thermal contacts between the heatsink and the layers above. As shown in FIG. 3, the heatsink can be directly connected to the substrate through the sintering layer. In certain embodiments, the heatsink can be directly connected to a cladding layer instead of the substrate through the silver sintering layer. This direct sintering of the substrate or cladding layer to the heatsink improves thermal performance and reliability since the substrate or cladding layer is thermally more directly connected. Cladding layer 350 also acts to thermally spread heat generated by the semiconductor layers.

In certain embodiments, the inverter consists of a semiconductor structure that comprises a MOSFET or an IGBT structure formed on a substrate. The MOSFET or IGBT structure may comprise a cladding layer, such as a copper cladding later. The MOSFET or IGBT structure may be formed from silicon, gallium nitride, silicon carbide, another III-V semiconductor, or another semiconductor. FIG. 1 illustrates a MOSFET structure according to certain embodiments of the invention. MOSFET structure 100 comprises a source connection 110 connected to a semiconductor region 150 through source connection pad 105. Drain connection 130 is connected to a second semiconductor region 160 through drain connection pad 106. Semiconductor 170 is a third semiconductor region. MOSFET structure 100 also comprises gate connection 120 and gate connection pad 140. Gate connection pad 140 may comprise an oxide layer. In certain embodiments, MOSFET structure 100 comprises a cladding layer that is a thick layer of copper for thermal spreading. The cladding layer may be formed on a substrate, such as a DBC, AMB, or a DPC.

In certain embodiments, semiconductor regions 150, 160 each comprise an n-type semiconductor, and semiconductor region comprises a p-type semiconductor. In certain embodiments, semiconductors 150, 160, and 170 are silicon, semiconductors 150 and 160 are doped to be n-type, and semiconductor 170 is doped to be p-type. In certain embodiments, semiconductors 150, 160, and 170 are gallium nitride, semiconductors 150 and 160 are doped to be n-type, and semiconductor 170 is doped to be p-type. In certain embodiments, semiconductors 150, 160, and 170 are silicon carbide, semiconductors 150 and 160 are doped to be n-type, and semiconductor 170 is doped to be p-type. In certain embodiments, the n-type and p-type semiconductor layers comprise the following semiconductors: silicon, gallium nitride (GaN), silicon carbide (SiC), another III-V semiconductor, or another semiconductor.

In certain embodiments, semiconductor regions 150, 160 each comprise a p-type semiconductor, and semiconductor region comprises an n-type semiconductor. In certain embodiments, semiconductors 150, 160, and 170 are silicon, semiconductors 150 and 160 are doped to be p-type, and semiconductor 170 is doped to be n-type. In certain embodiments semiconductors 150, 160, and 170 are gallium nitride, semiconductors 150 and 160 are doped to be p-type, and semiconductor 170 is doped to be n-type. In certain embodiments, semiconductors 150, 160, and 170 are silicon carbide, semiconductors 150 and 160 are doped to be p-type, and semiconductor 170 is doped to be n-type. In certain embodiments, the n-type and p-type semiconductor layers comprise the following semiconductors: silicon, gallium nitride (GaN), silicon carbide (SiC), another III-V semiconductor, or another semiconductor.

Figure 2:
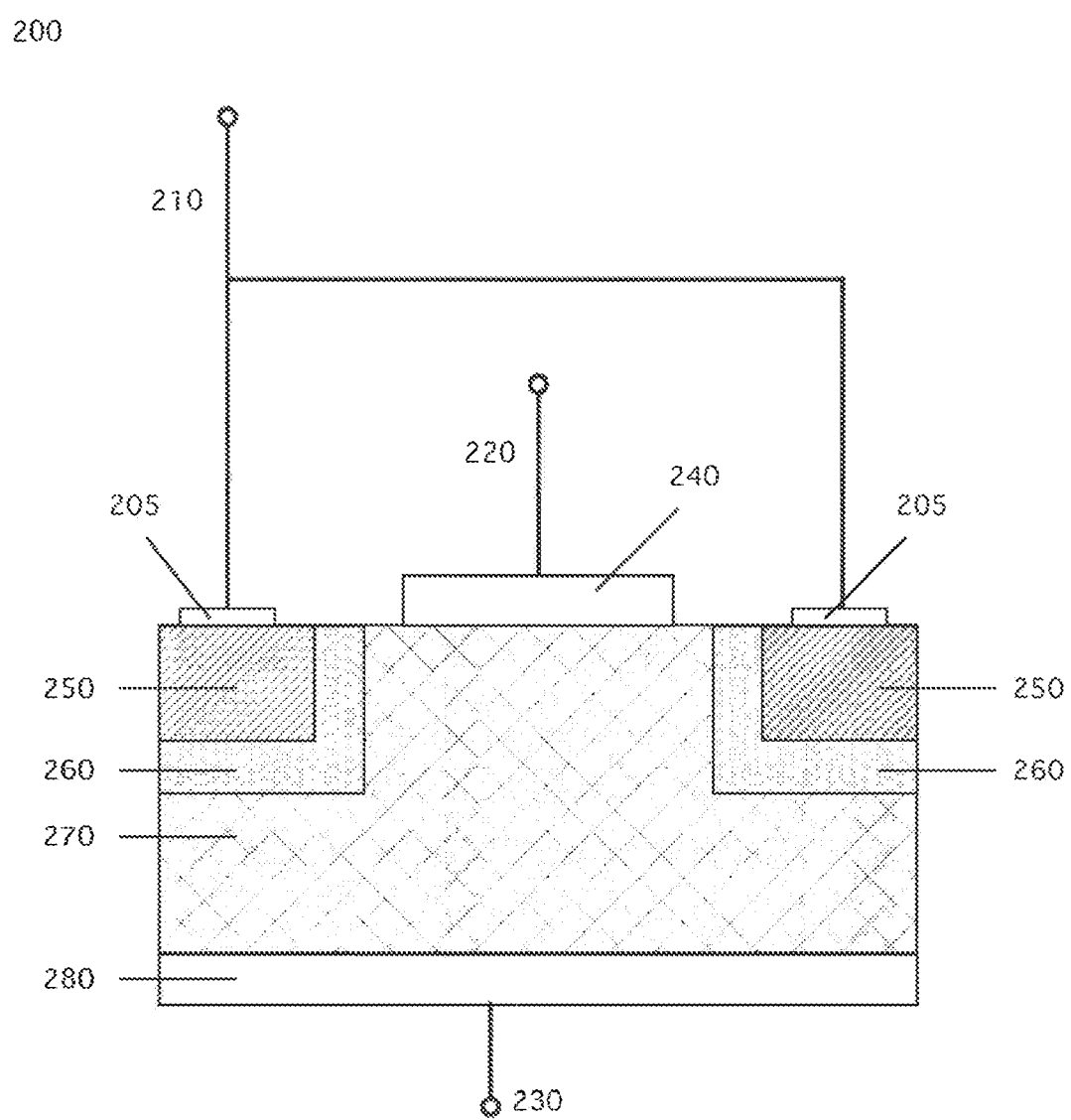
FIG. 2 illustrates an insulated-gate bipolar transistor (IGBT) structure according to certain embodiments of the present invention.

In certain embodiments, the inverter consists of a semiconductor structure that comprises an IGBT structure. IGBT structure 200 according to certain embodiments of the present invention is shown in FIG. 2. The IGBT may comprise silicon, gallium nitride, silicon carbide, another III-V semiconductor, or another semiconductor.

IGBT structure 200 comprises an emitter connection 210 that is connected to a semiconductor region 250 through emitter connection pads 205. Semiconductor region 250 is next to a second semiconductor region 260. Collector connection 230 is connected to a third semiconductor region 280. Semiconductor 270 is a fourth semiconductor region. IGBT structure 200 also comprises gate connection 220 and gate connection pad 240. Gate connection pad 240 may comprise an oxide layer. In certain embodiments, IGBT structure 200 comprises an additional cladding layer that is a thick layer of copper for thermal spreading. The cladding layer may be formed on a substrate, such as a DBC, AMB, or a DPC.

In certain embodiments, semiconductor regions 250 and 270 each comprise an n-type semiconductor, and semiconductor regions 260 and 280 comprise a p-type semiconductor. In certain embodiments, semiconductors 250, 260, 270, and 280 are silicon, semiconductors 250 and 270 are doped to be n-type, and semiconductors 260 and 280 are doped to be p-type. In certain embodiments, semiconductors 250, 260, 270, and 280 are gallium nitride, semiconductors 250 and 270 are doped to be n-type, and semiconductors 260 and 280 are doped to be p-type. In certain embodiments, semiconductors 250, 260, 270, and 280 are silicon carbide, semiconductors 250 and 270 are doped to be n-type, and semiconductors 260 and 280 are doped to be p-type. In certain embodiments, the n-type and p-type semiconductor layers comprise the following semiconductors: silicon, gallium nitride (GaN), silicon carbide (SiC), another III-V semiconductor, or another semiconductor.

In certain embodiments, semiconductor regions 250 and 270 each comprise a p-type semiconductor, and semiconductor regions 260 and 280 each comprise an n-type semiconductor. In certain embodiments, semiconductors 250, 260, 270, and 280 are silicon, semiconductors 250 and 270 are doped to be p-type, and semiconductors 260 and 280 are doped to be n-type. In certain embodiments semiconductors 250, 260, 270, and 280 are gallium nitride, semiconductors 250 and 270 are doped to be p-type, and semiconductors 260 and 280 are doped to be n-type. In certain embodiments, semiconductors 250, 260, 270, and 280 are silicon carbide, semiconductors 250 and 270 are doped to be p-type, and semiconductors 260 and 280 are doped to be n-type. In certain embodiments, the n-type and p-type semiconductor layers comprise the following semiconductors: silicon, gallium nitride (GaN), silicon carbide (SiC), another III-V semiconductor, or another semiconductor.

In certain embodiments, the package may comprise more than one transistor or semiconductor structure. In certain embodiments, the package comprises a diode structure connected in series with a MOSFET structure. In certain embodiments, the packaged transistor comprises a diode structure connected in series with an IGBT structure.

Figure 4:
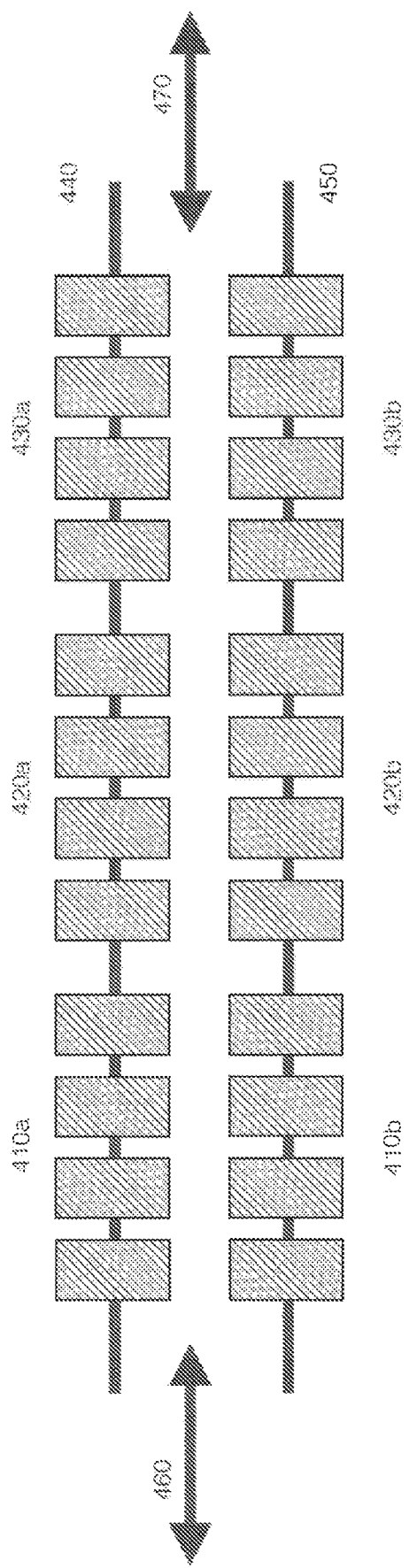
FIG. 4 is a schematic illustration of a busbar connecting transistor packages according to certain embodiments of the present invention.

FIG. 4 is a schematic illustration of a busbar connecting transistor packages according to certain embodiments of the present invention. Busbar 440 connects transistor packages in the horizontal, or x-direction. Similarly, busbar 450 connect different transistor packages in the horizontal, or x-direction. As indicated in FIG. 4, each horizontal row consists of three sets of transistor packages. Groups 410a, 420a, and 430a are connected in the horizontal or x-direction. Similarly, groups 410b, 420b, and 430b are connected in the horizontal or x-direction. In certain embodiments, fewer than three groups of transistor packages exist. The transistor packages may be spaced such that no distinguishable groups exist. The number of transistor packages may also vary. As shown in FIG. 4, the current flows in the horizontal, or x-axis of the figure, not in the vertical or y-axis. Arrows 460 and 470 indicate the direction of current flow in the x-direction in the busbar. As FIG. 4 shows, the groups of transistor packages (410a, 420a, and 430a) are connected in series. Similarly, the groups of transistor packages (410b, 420b, and 430b) are connected in series. In certain embodiments, positive and negative busbars connect different groups of inverters. For example, one group of encased transistors (410a, 420a, and 430a) is connected using a positive busbar and a second group of encased transistors (410b, 420b, and 430b) is connected using a negative busbar. In certain embodiments, this configuration of positive and negative rows alternates. This horizontal or parallel plane for both the positive and negative busbars reduces inductance. In certain embodiments, additional busbars may carry current in the vertical or y-direction. These busbars may be in a plane above or below the plane with the inverters.

Figure 5B:
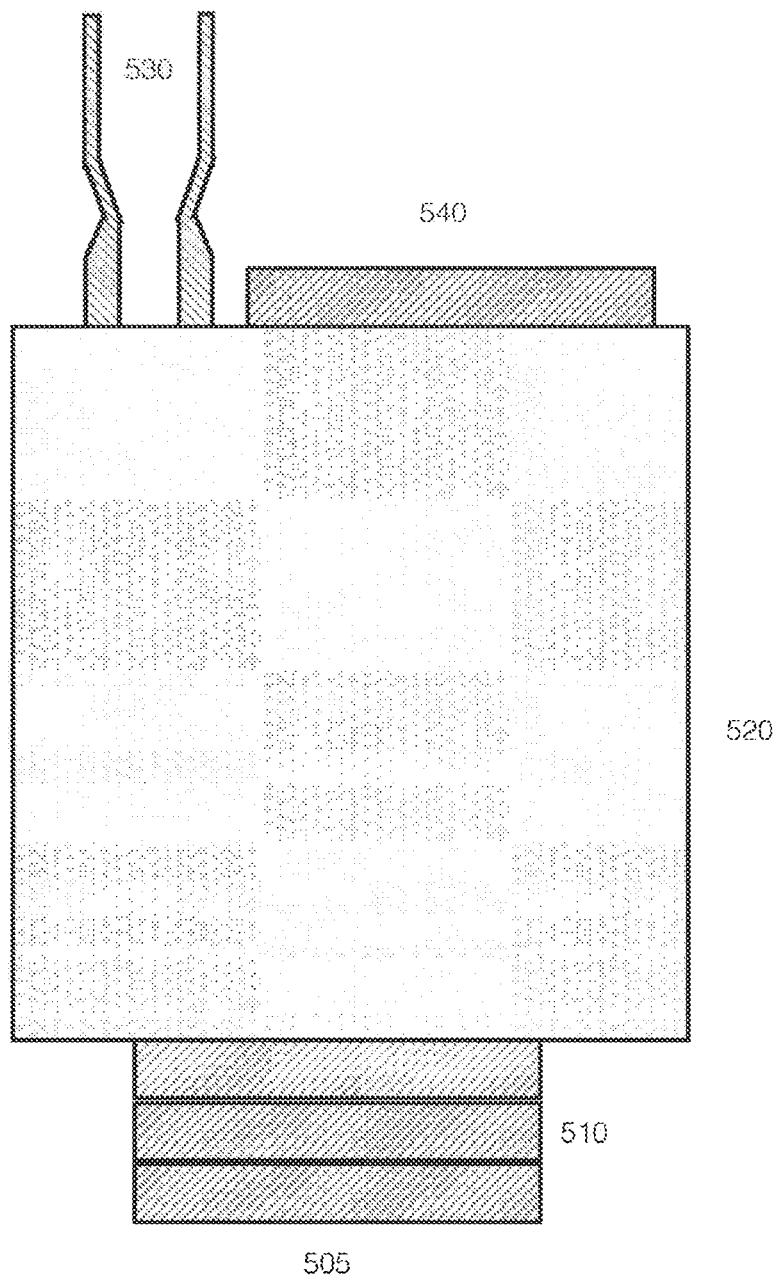
FIG. 5B illustrates a transistor package according to certain embodiments of the present invention.

FIGS. 5A and 5B illustrate a transistor package according to certain embodiments of the present invention. With reference to FIG. 5A, a busbar connector 505 having a u-bend 510 and a busbar connection 540 are shown. The busbar allows current to flow to one or more encased transistors 520. The layout of groups of the encased transistors are illustrated in FIG. 4. Groups of transistors (410a, 410b, 420a, 420b, 430a, and 430b) are shown in FIG. 4. The Kelvin connection 530 includes a first connector that connects to the gate of an encased transistor at one end. The other connector of the Kelvin connection 530 can be connected to a differing terminal of the encased transistor. The transistor and transistor package according to the current disclosure has enhanced thermal performance and faster switching speeds over traditional transistors and transistor packages due to the Kelvin connection that is connected directly to the gate. The busbar connection 540 may be used to connect the package to an external busbar or other electronic wiring.

Figure 5C:
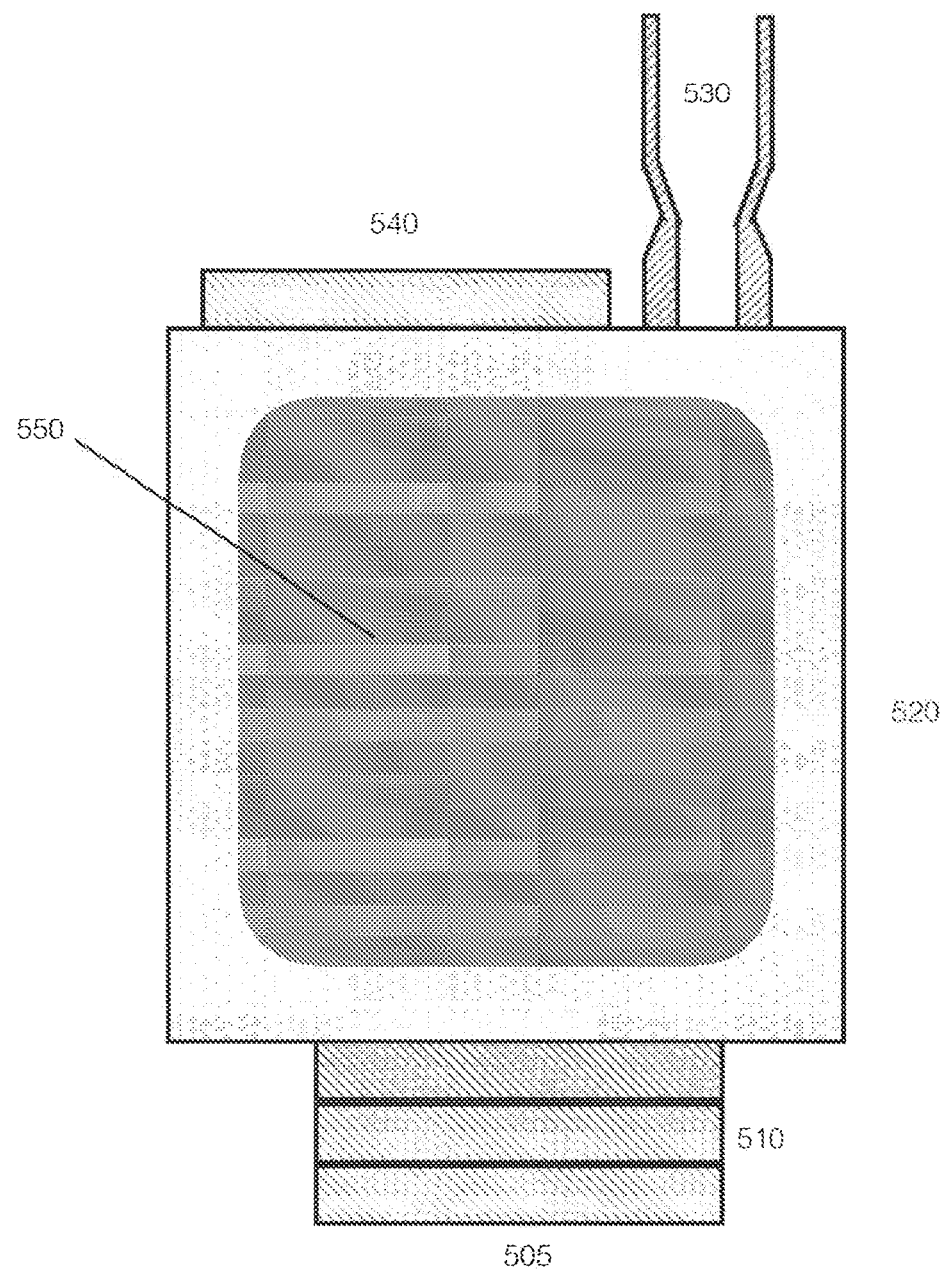
FIG. 5C illustrates a transistor package according to certain embodiments of the present invention.

FIG. 5C illustrates the back of a transistor package according to certain embodiments of the present invention.

In addition to the other elements visible in the views shown in FIGS. 5A and 5B, a sintering layer 550 is visible. The sintering layer directly sinters the semiconductor structure that is the inverter onto the heat sink. Sintering the semiconductor structure directly to the heat sink improves the thermal performance and reliability of the semiconductor device. In certain embodiments, the sintering layer 550 is a silver layer. The sintering layer 550 may be formed using a sinter paste (such as a silver paste), microparticles of silver, nanoparticles of silver, or another silver source. In certain embodiments, the sintering layer 550 is another metal including platinum, palladium, or gold.

Figure 6A:
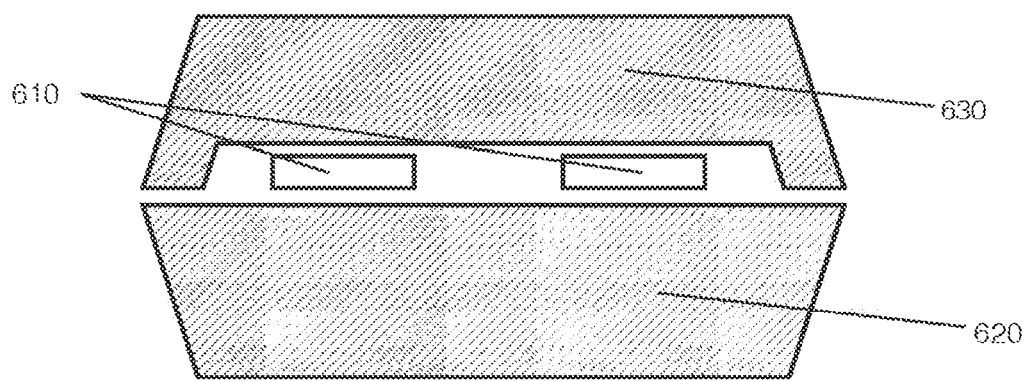
FIG. 6A illustrates the inverter housing according to certain embodiments of the present invention.
Figure 6B:
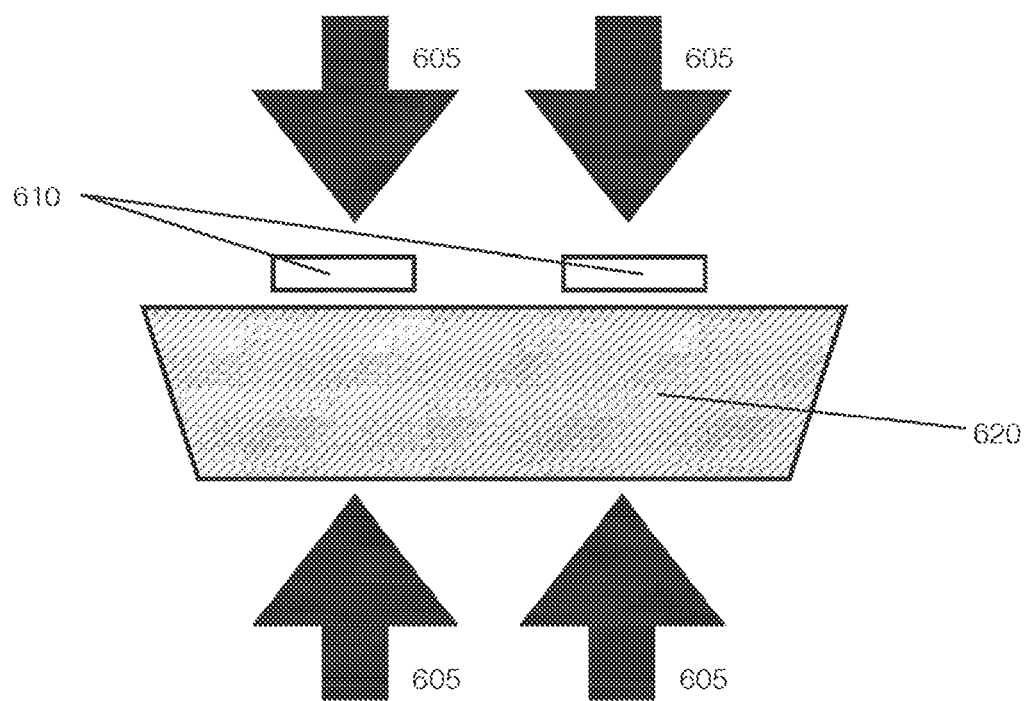
FIG. 6B illustrates the lower inverter housing and location of where pressure is applied to form the connection between transistor packages and the lower inverter housing according to certain embodiments of the present invention.

FIG. 6A illustrates the housing of the inverter according to certain embodiments of the present invention. Transistor packages 610 are contained within lower inverter housing 620 and upper inversion housing 630. Both lower inverter housing 620 and upper inverter housing 630 may be formed from a metal, such as steel or aluminum. In certain embodiments, lower inverter housing 620 and upper inverter housing 630 may comprise a soft or inexpensive metal, such as lead, with as outer metal layer, such as aluminum. The outer metal layer may have more desirable thermal or structural properties, but may be more expensive than the metal inside. Lower inverter housing 620 is thermally connected to transistor packages 610 and is a heat sink, dissipating heat from transistor packages 610. Upper inverter housing 630 may also be thermally connected to lower inverter housing 620 and transistor packages 610, although it need not be. To form the sintering layer between the transistor packages and the heat sink, pressure, or another force, is applied from the bottom of the lower inverter housing 620 (which can be a heat sink) and above the transistor package as illustrated with arrows 605 in FIG. 6B. In certain embodiments of the present invention, a lower force is applied only to the portion of the lower inverter housing that is below the transistor packaging and an upper force is applied above each transistor package. As shown in FIG. 6B, a force is applied below the portions of the lower inverter housing 620 that are below the two transistor packages 610 shown, and a force is applied on top of the two transistor packages. In certain embodiments, the portion of the lower inverter housing to which a force is applied comprises fins. The fins may be used to dissipate heat as part of the heat sink.

Figure 7A:
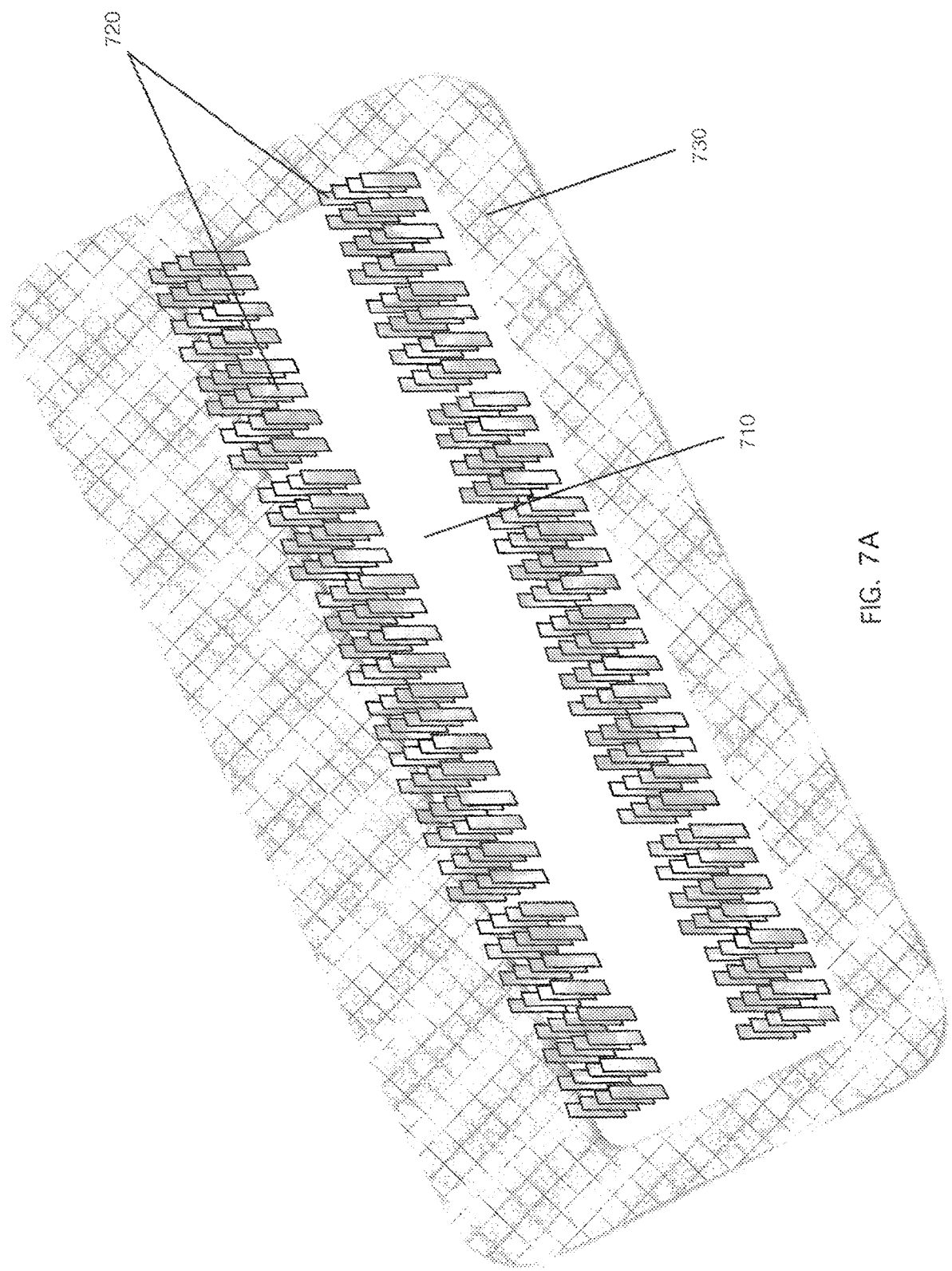
FIG. 7A illustrates the well and pin design of the inverter housing according to certain embodiments of the present disclosure.

FIG. 7A illustrates the well and pin design of the inverter housing according to certain embodiments of the present disclosure. Well 710 is formed within lower inverter housing 730. Lower inverter housing 730 may be formed from a metal, such as steel or aluminum. Within well 710 are fins 720. Fins may be formed from the same material as lower inverter housing 730 or another material. In certain embodiments, fins 720 are formed from the same material as housing 730. In certain embodiments, lower inverter housing 730 and fins 720 are formed together. That is fins 720 are formed together with lower inverter housing 730 and not added later. Fins 720 and lower inverter housing 730 may be formed through a molding process, through a deposition technique, through a three-dimensional printing technique, or through another process. The fins 720 are used to form a connection to the transistor package by helping to ensure that sufficient pressure is applied to form the sintering layer between the heat sink and the transistor packages.

In certain embodiments, lower inverter housing 730 may comprise a soft or inexpensive metal, such as lead, with as outer metal layer, such as aluminum. The outer metal layer may have more desirable thermal or structural properties, but may be more expensive than the metal inside. In certain embodiments, the lower inverter housing 730 (or a portion of it) is a heat sink.

Figure 7B:
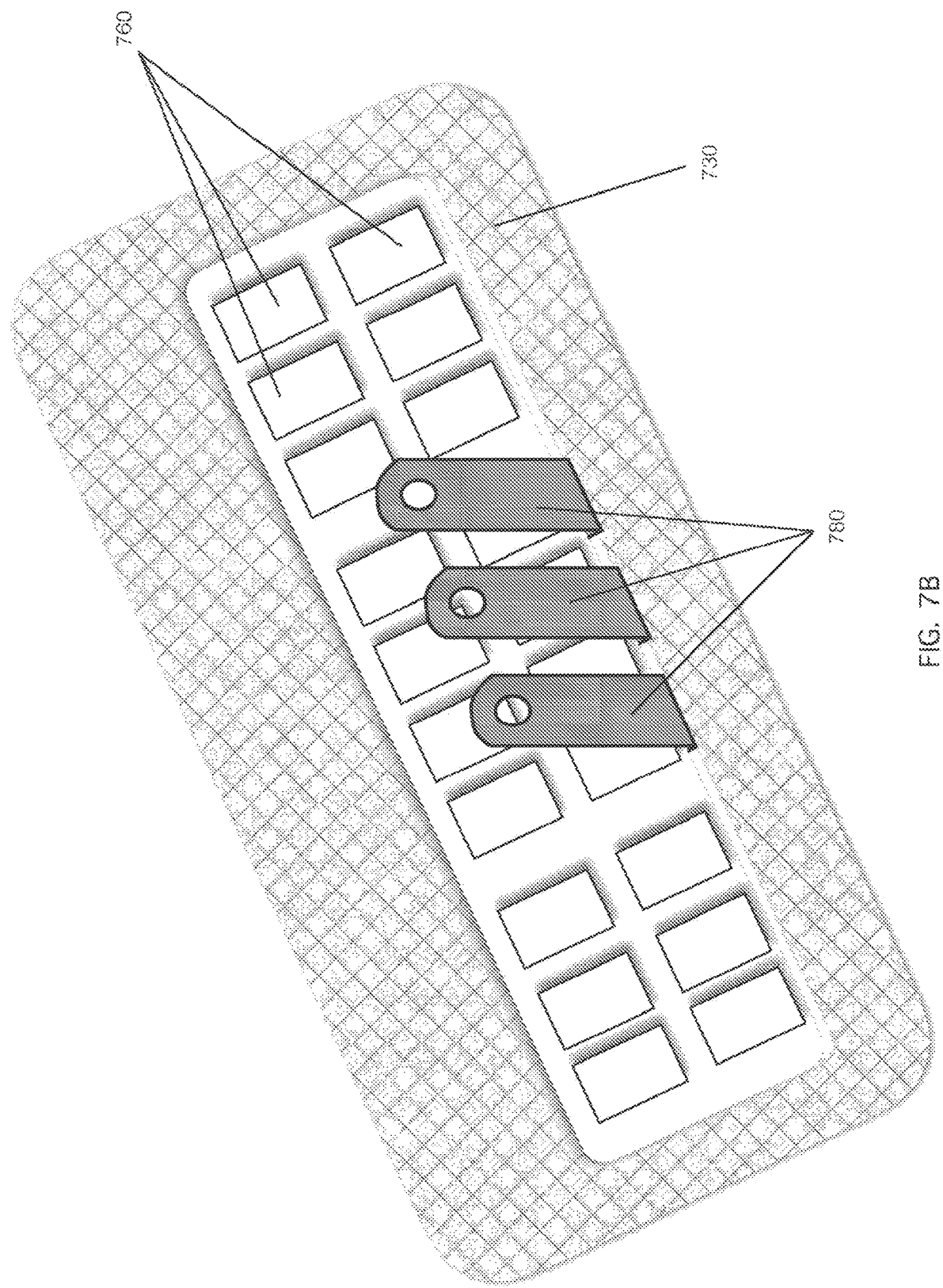
FIG. 7B illustrates a busbar with finger design according to certain embodiments of the present invention.
Figure 7C:
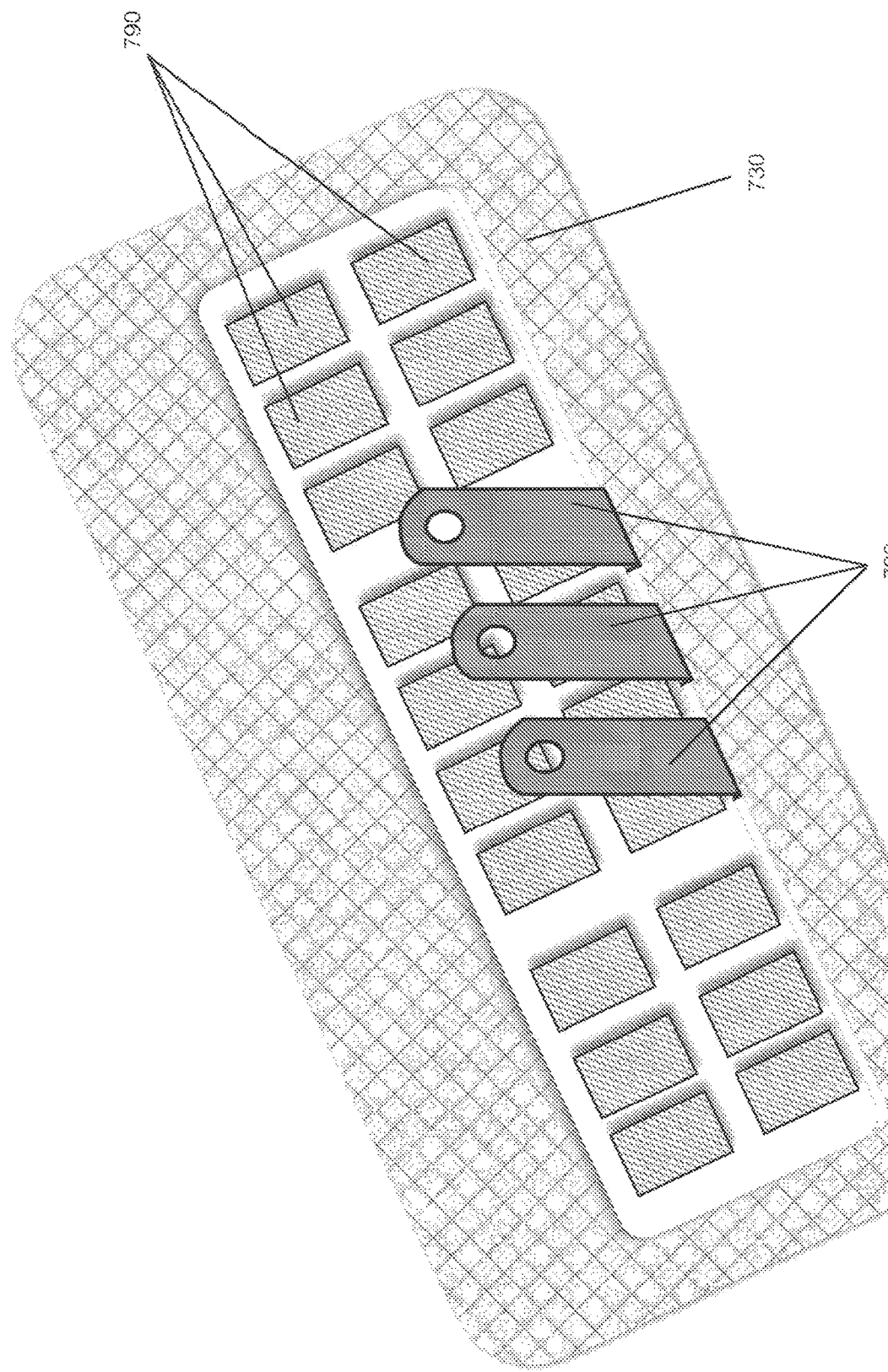
FIG. 7C illustrates a busbar with finger design according to certain embodiments of the present invention.

FIGS. 7B and 7C illustrate a busbar with finger design according to certain embodiments of the present invention. FIG. 7B illustrates the lower inverter housing 730 and the connected contact pads 760. The contact pads are then connected to the packaged transistors. In certain embodiments, the sintering layer is a silver layer. The sintering layer may be formed using a sinter paste (such as a silver paste), microparticles of silver, nanoparticles of silver, or another silver source. In certain embodiments, the sintering layer is another metal including platinum, palladium, or gold.

As illustrated in the embodiment shown in FIGS. 7B and 7C, a busbar 780 extends perpendicularly from the plane containing the transistor packages 790 and contact pads 760. Busbar 780 preferentially contains three fingers (although it may contain more or fewer). The flat fingers of busbar 780 provide an easier surface for welding. This is desirable to ensure a good electrical and mechanical connection. Laser or electron-beam welding may be used to weld the busbar 780 to another busbar or other electrical component. In certain embodiments, busbar 780 is connected to an AC induction motor. The flat geometry of busbar 780 provides a good surface to create an electrical connection that has low inductance. Without the flat fingers of busbar 780, it may be difficult to form reliable electrical connections with low impedance.

Fins 720 are connected to contact pads 760. FIG. 7A illustrates the fins 720. Contact pads 760 are connected to the fins 720. Each contact pad is connected to a one or more fins. Preferably, multiple fins will be thermally connected to a contact pad to ensure that heat generated by a transistor package 790 is transferred through a contact pad 760 to the fins 720 and to the inverter housing which acts as a heat sink. Fins 720 are connected to contact pads 760 by applying pressure to sinter the fins 720 to the contact pads 760. Preferably, pressure or a force is applied from both the underside and the top side to form the sintering layer that thermally connects the contact pads 760 to the transistor packages 790. Applying pressure or a force from both sides is advantageous so that a smaller (lower magnitude) pressure or force is required to be applied from each side than if the pressure/force were applied from only one side. This allows the contacts to be formed without deforming the fins 720, which can occur if too large of a pressure/force is applied.

Figure 8:
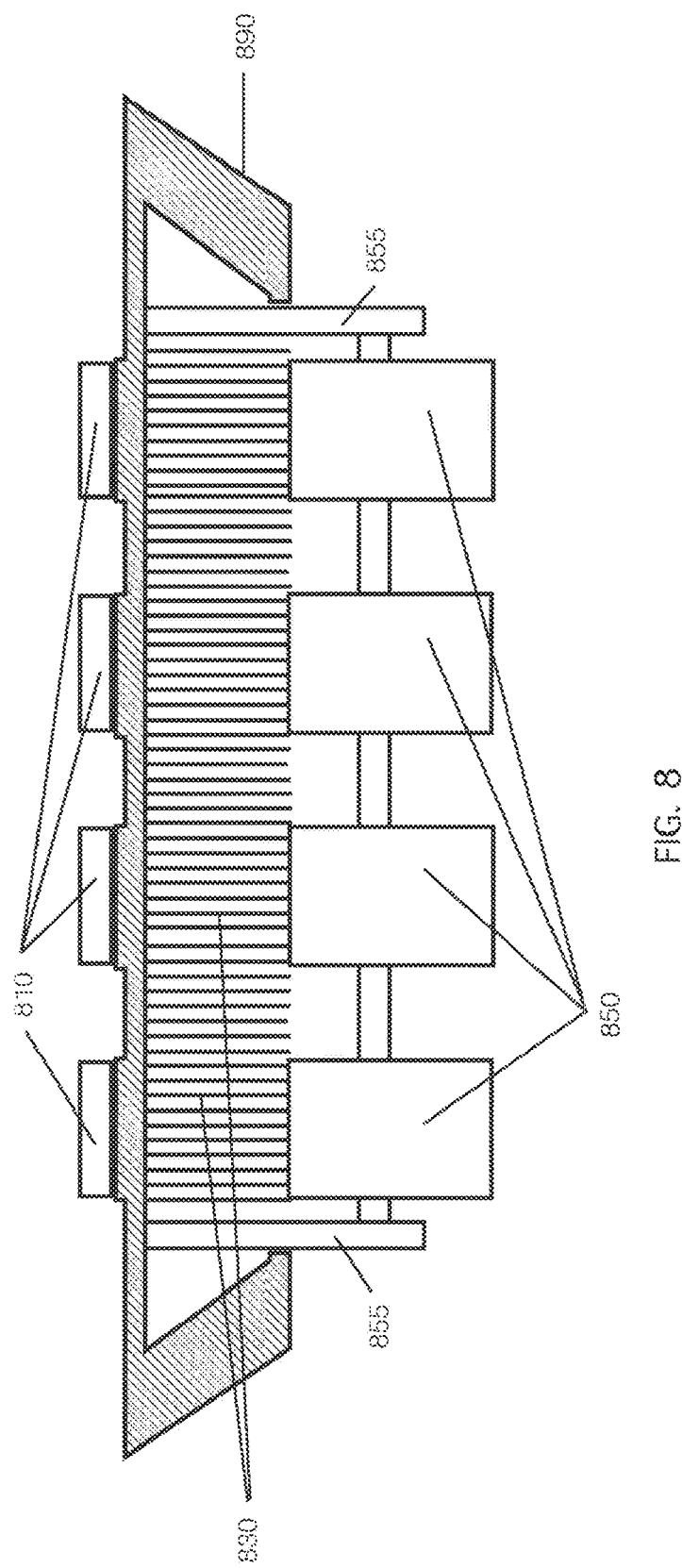
FIG. 8 illustrates a cross-section view of the inverter and independently actuated press blocks according to certain embodiments of the present invention.

FIG. 8 illustrates a view of portions of the inverter and the independently actuated press blocks that are used to sinter the transistor packages according to certain embodiments of the present invention. In the cross section, four transistor packages 810 are shown. Other numbers of transistor packages may exist in one row, including twelve packages as shown in FIG. 7C. With reference to FIG. 8, fins 830 are formed under transistor packages 810. In the embodiment shown in FIG. 8, lower inverter housing 890 comprises fins 830 and contact pads (shown as the raised portion of 890 below the inverter packages 810). All or part of lower inverter housing 890 may be a heat sink to dissipate heat generated by the inverters inside the inverter packages.

Contact pads form a connection between the rest of the lower inverter housing 890 and the transistor packages 810. To sinter the contact pads to the transistor packages 810, a force is applied above each transistor package 810 and another force is applied below the fins 830 that are below each transistor packages. The force below fins 830 is applied using an independently actuated press blocks according to certain embodiments of the invention. The independently actuated press blocks 850 shown below the fins help apply a more uniform pressure to the sintering interface than do single-sided blocks. Independently actuated press blocks may also apply the pressure above the transistor package 810. Mechanical stabilizers 855 provide mechanical stability when sintering the contact pads to the transistor packages. The points (or area) where the mechanical stabilizers 855 contact the lower inverter housing 890 are confined from moving when force is applied during the sintering process. Because the force applied above the transistor packages may be greater than the force applied below the transistor packages, deflection of the inverter housing 890 may occur, with the center of the lower inverter housing deflecting or bending relative to the points (or areas) confined by the mechanical stabilizers. Despite any deflection, the double-sided independently actuated press blocks allow for the formation of the contact between the contact pad of the lower inverter housing 890 and the inverter packaging. The sintering quality using double-sided independently actuated press blocks is better than conventional single sided blocks. The improved sintering quality allows for high thermal performance, which then increases the reliability and lifetime of the inverter.

In certain embodiments, the transistor package is sintered to the contact pads of the heat sink. In certain embodiments, the lower inverter housing is the heat sink. In certain embodiments, the fins are forged from the same material as the other portions of the lower inverter housing. The lower inverter housing may be made from steel, aluminum, or lead. The forging material to form the fins may have a high thermal conductivity of approximately 220 W/m-K. In certain embodiments, the fins are forged from steel, aluminum, or lead. In certain embodiments, a second metal layer is deposited, cast, overmolded or otherwise formed on top of the housing and/or the fins. In certain embodiments, fins 830 are formed by overmolding and/or die casting aluminum. Aluminum has a relatively low thermal conductivity of approximately 100 W/m-K and is therefore a desirable choice due to its advantageous thermal properties. Forming the fins and heat sinks through forging, followed by overmolding or die casting according to certain embodiments of the present invention is a cost effective way to manufacture heat sinks for industrial production. Further, the formed heat sink formed possesses the thermal necessary properties to remove the heat from the transistor package.

To form the thermal connection to the transistor package through a sintering process requires high pressure. The required pressure can be as high as 10-15 MPa, which must be applied from both above and below the transistor package. Further, in certain embodiments of the present invention, the pressure is applied uniformly from both the bottom of the lower inverter housing and above the transistor package. Because the forged fins and die-cast aluminum cannot handle high pressure, double-sided independently actuated press blocks are used according to certain embodiments of the present invention. The double-sided independently actuated press blocks help apply a uniform pressure to the fins with one independently actuated press block applying a pressure to the fins and the other independently actuated press block applying pressure to transistor package. In certain embodiments, the independently actuated press blocks are only under the region below the contact pads.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, a person of ordinary skill in the art will recognize that changes may be made in form and detail without departing from the scope of the present disclosure. Thus, the present disclosure is limited only by the claims.

In the foregoing specification, the disclosure has been described with reference to specific embodiments. However, as one skilled in the art will appreciate, various embodiments disclosed herein can be modified or otherwise implemented in various other ways without departing from the spirit and scope of the disclosure. Accordingly, this description is to be considered as illustrative and is for the purpose of teaching those skilled in the art the manner of making and using various embodiments of the disclosed system, method, and computer program product. It is to be understood that the forms of disclosure herein shown and described are to be taken as representative embodiments. Equivalent elements, materials, processes or steps may be substituted for those representatively illustrated and described herein. Moreover, certain features of the disclosure may be utilized independently of the use of other features, all as would be apparent to one skilled in the art after having the benefit of this description of the disclosure.

As used herein, the terms "comprises," "comprising," "includes," "including," "has," "having" or any contextual variants thereof, are intended to cover a non-exclusive inclusion. For example, a process, product, article, or apparatus that comprises a list of elements is not necessarily limited to only those elements, but may include other elements not expressly listed or inherent to such process, product, article, or apparatus. Further, unless expressly stated to the contrary, "or" refers to an inclusive or and not to an exclusive or. For example, a condition "A or B" is satisfied by any one of the following: A is true (or present) and B is false (or not present), A is false (or not present) and B is true (or present), and both A and B is true (or present).

Although the steps, operations, or computations may be presented in a specific order, this order may be changed in different embodiments. In some embodiments, to the extent multiple steps are shown as sequential in this specification, some combination of such steps in alternative embodiments may be performed at the same time. The sequence of operations described herein can be interrupted, suspended, reversed, or otherwise controlled by another process.

It will also be appreciated that one or more of the elements depicted in the drawings/figures can also be implemented in a more separated or integrated manner, or even removed or rendered as inoperable in certain cases, as is useful in accordance with a particular application. Additionally, any signal arrows in the drawings/figures should be considered only as exemplary, and not limiting, unless otherwise specifically specified.

What is claimed is:

1. A method for producing a transistor package, the method comprising:
   providing a substrate;
   depositing a first transistor such that the first transistor is in thermal contact with the substrate;
   directly sintering the substrate to a heat sink through a sintering layer;
   at least partially encapsulating the first transistor with an encapsulant; and
   creating a Kelvin connection to the first transistor, the Kelvin connection having a first connector directly coupled at a first end to a transistor gate of the first transistor and a second connector directly coupled at a first end to a differing terminal of the first transistor, wherein the encapsulant further encapsulates a portion of each of the first connector and the second connector, including the first end of the first connector and the first end of the second connector.

2. The method of claim 1, wherein the heat sink comprises fins and contact pads.

3. The method of claim 1, further comprising providing a second transistor that is in series with the first transistor.

4. The method of claim 3, wherein the first transistor is an insulated-gate bipolar transistor and the second transistor is a diode transistor.

5. The method of claim 3, wherein the first transistor is a metal-oxide-semiconductor-field-effect transistor and the second transistor is a diode transistor.

6. The method of claim 1, wherein the transistor package further comprises a copper cladding layer and the Kelvin connection is further connected to a busbar.

7. The method of claim 1, wherein the first transistor comprises a gallium nitride or a silicon carbide wideband semiconductor.

8. The method of claim 1, wherein the sintering includes applying a first force from above the encapsulated first transistor and applying a second force from below the heatsink in a direction opposite to the first force.

9. The method of claim 8, wherein the first force is applied utilizing a first independently actuated press block.

10. The method of claim 8, wherein the second force is applied utilizing a second independently actuated press block.

11. The method of claim 10, wherein the second independently actuated press block is double sided.

12. The method of claim 1, additionally comprising providing an external busbar connector, the connector having a "U"-bend shape being connected to the transistor package.

13. The method of claim 1, additionally comprising providing a busbar connector interconnecting the first transistor to either a positive busbar or a negative busbar for providing current to the first transistor.

14. A method for producing a transistor package, the method comprising:
providing a cladding layer;
depositing a first transistor such that the first transistor is in thermal contact with the cladding layer;
directly sintering the cladding layer to a heat sink through a sintering layer;
at least partially encapsulating the first transistor with an encapsulant; and
creating a Kelvin connection to the first transistor, the Kelvin connection having a first connector directly coupled at a first end to a transistor gate of the first transistor and a second connector directly coupled at a first end to a differing terminal of the first transistor, wherein the encapsulant further encapsulates a portion of each of the first connector and the second connector, including the first end of the first connector and the first end of the second connector.

15. The method of claim 14, wherein the cladding layer comprises copper.

16. The method of claim 14, further comprising providing a second transistor that is in series with the first transistor.

17. The method of claim 16, wherein the first transistor is an insulated-gate bipolar transistor or a metal-oxide-semiconductor-field-effect transistor and the second transistor is a diode transistor.

18. The method of claim 14, wherein the sintering includes applying a first force from above the encapsulated first transistor and applying a second force from below the heatsink in a direction opposite to the first force.

19. The method of claim 18, wherein the first force is applied utilizing a first independently actuated press block and the second force is applied utilizing a second independently actuated press block.

20. The method of claim 14, additionally comprising providing an external busbar connector, the connector having a "U"-bend shape being connected to the transistor package.

21. A method for producing a transistor package, the method comprising:
providing a substrate;
depositing an insulated-gate bipolar transistor such that the transistor is in thermal contact with the substrate;
directly sintering the substrate to a heat sink through a sintering layer;
at least partially encapsulating the insulated-gate bipolar transistor with an encapsulant; and
creating a Kelvin connection to the insulated-gate bipolar transistor, the Kelvin connection having a first connector directly coupled at a first end to a gate of the insulated-gate bipolar transistor and a second connector directly coupled at a first end to an emitter of the insulated-gate bipolar transistor, wherein the encapsulant further encapsulates a portion of each of the first connector and the second connector, including the first end of the first connector and the first end of the second connector.

22. The method of claim 21, further comprising providing another transistor that is in series with the insulated-gate bipolar transistor.

* * * * *